United States Patent [19]

Neugebauer et al.

[11] Patent Number: 5,139,972
[45] Date of Patent: Aug. 18, 1992

[54] BATCH ASSEMBLY OF HIGH DENSITY HERMETIC PACKAGES FOR POWER SEMICONDUCTOR CHIPS

[75] Inventors: Constantine A. Neugebauer, Schenectady; Victor A. K. Temple, Jonesville, both of N.Y.

[73] Assignee: General Electric Company, Schenectady, N.Y.

[21] Appl. No.: 661,946

[22] Filed: Feb. 28, 1991

[51] Int. Cl.$^5$ .............................................. H01L 21/60
[52] U.S. Cl. .................... 433/209; 437/205; 437/221
[58] Field of Search ............... 433/209, 224, 221, 218, 433/205; 357/74, 81; 174/52.3, 52.4; 29/831, 832, 835

[56] References Cited

U.S. PATENT DOCUMENTS

| | | |
|---|---|---|
| 3,744,120 | 7/1973 | Burgess et al. |
| 3,766,616 | 10/1973 | Staudte ............................ 29/592.1 |
| 3,854,892 | 12/1974 | Burgess et al. |
| 3,911,553 | 10/1975 | Burgess et al. |
| 3,936,928 | 2/1976 | Hopp ............................... 437/205 |
| 4,129,243 | 12/1978 | Cusano et al. |
| 4,409,278 | 10/1983 | Jochym . |
| 4,563,383 | 1/1986 | Kuneman et al. |
| 4,646,129 | 2/1987 | Yerman et al. ................... 357/81 |
| 4,654,693 | 3/1987 | Funakoshi et al. .............. 357/74 |
| 4,774,632 | 9/1988 | Neugebauer ..................... 357/81 |
| 4,814,943 | 3/1989 | Okuaki ........................... 174/52.3 |
| 4,985,752 | 1/1991 | Crowe et al. ................... 357/74 |
| 5,018,002 | 5/1991 | Neugebauer ..................... 357/74 |

OTHER PUBLICATIONS

MCT Power Packaging by C. A. Neugebauer, J. F. Burgess, H. H. Glascock, V. A. K. Temple, and D. L. Watrous—May 1990.

Primary Examiner—Brian E. Hearn
Assistant Examiner—Michael Trinh
Attorney, Agent, or Firm—Marvin Snyder; James C. Davis, Jr.

[57] ABSTRACT

Batch assembly methods for high density packaging of power semiconductor chips in hermetic thin packagings includes providing silicon chip arrays with thermocompressively bonded foil contacts, preparing ceramic lid arrays which contain upper surface and lower margin direct-bonded copper coverings and through-the-lid high current spherical conductors, coining Cu/Mo/Cu or copper cup arrays, die mounting within each respective cup a respective semiconductor chip, superpositionally registering a lid array with a strip form of cup array, and solder reflowing to hermetically seal all hermetic thin packagings within a registered set of cup and lid arrays.

8 Claims, 2 Drawing Sheets

BATCH ASSEMBLY OF HIGH DENSITY HERMETIC PACKAGES FOR POWER SEMICONDUCTOR CHIPS

RELATED APPLICATIONS

This application is related to U.S. patent application Ser. No. 07/603,495, filed on Oct. 26, 1990 and entitled: "DIRECT THERMOCOMPRESSION BONDING TECHNOLOGY FOR THIN ELECTRONIC POWER CHIP PACKAGES" by C. A. Neugebauer et al., pending application. That application, which is incorporated herein by reference, is concerned with manufacturing techniques for inductance-free electrical lead/connection technology relating to thin, hermetically sealed electronic power chip packages, and describes batch techniques for thermocompression bonding of copper foil, batch techniques to manufacture hermetic thin pack package parts, and batch techniques for hermetic thin pack assembly.

BACKGROUND OF THE INVENTION

1. Field of the Invention

This invention relates generally to the low cost fabrication of hermetic thin packagings (HTPs) of high density power semiconductors and, more specifically, to methods for providing such fabrication by batch assembly. The primary thrust of the batch assembly concept is to maintain integrity of chip arrays, package containment arrays and package lid arrays as far into the fabrication and final assembly process as is technologically and economically feasible, thereby avoiding such detrimental aspects of production as excessive handling, specialized treatment of individualized components, the necessity of employing solder preforms, and reliance upon specially fabricated frames and/or individual die apparatus.

2. Background Information

In a previously known approach for construction of the high density power packages known as HTPs, achievement of a packing density amounting to 42% of the theoretically achievable silicon area availability was deemed noteworthy. There have been, however, several economic drawbacks in some of the HTP material and process steps. Thus, throughout development of the hereinafter disclosed batch fabrication processes, a number of drawbacks to the previous approach were targeted for special attention and were systematically optimized, if not eliminated entirely. The drawbacks of concern are primarily those that give rise to excessive component handling, such as in fabricating individual ceramic lids, casings or cups for the packages, and preparing device and device mounting at an individual die level. Other drawbacks of concern include excessive set up times and materials, as well as the requirement to use solder preforms or the compelled use of copper/molybdenum/copper (Cu/Mo/Cu) frames for construction of the cup in which the chip is die mounted.

The instant invention employs a number of processes which derive their high utility and economic value from new developments and technology such as that noted in the aforementioned application Ser. No. 07/603,495, pending application. For this reason, one skilled in the art should be aware of the existence of such technology so that a concise and comprehensive explanation of the instant invention may ensue.

In one aspect of the invention, thermocompression bonding of copper foil conductors to the aluminum metallization of a power semiconductor chip, disclosed in the referenced application Ser. No. 07/603,495, pending application, for the individual chip device level, is extended to the multi-chip device level or batch manufacture. A full appreciation of the teachings regarding thermocompression bonded copper foil conductors may be obtained from the article entitled: "MCT Power Packaging" by C. A. Neugebauer, J. F. Burgess, H. H. Glascock, V. A. K. Temple and D. L. Watrous as presented in the Proceedings of the 40th IEEE ETCT, May 1990, which is herein incorporated by reference.

The development of the HTP packaging approach has resulted in a hermetic package outline not much bigger than the chip itself. This unique packaging was achieved by replacing the traditional aluminum wire bonds with small copper spheres (approximately 0.040 in. in diameter), which make connections to the chip topside contact (typically gate and anode) through holes extending directly through the ceramic (alumina) package lid. Electrical contact is made to the chip through bonding, as by means of thermocompression and solders, and contact to the lid is made by means of hermetically direct-bonded copper (DBC) foil. Attainment of hermeticity is adequately disclosed in the aforementioned Neugebauer et al. IEEE article and elsewhere, such as in H. F. Webster U.S. patent application Ser. No. 07/454,548, filed Dec. 21, 1989, pending application, entitled "CERAMIC-TO-CONDUCTING-LEAD HERMETIC SEAL" and in V. A. K. Temple et al. U.S. patent application Ser. No. 07/367,525, filed Jun. 16, 1989, entitled "HERMETIC PACKAGE HAVING A LEAD EXTENDING THROUGH AN APERTURE IN THE PACKAGE LID AND PACKAGE SEMICONDUCTOR CHIP", U.S. Pat. No. 5,069,879. Essentially, the aforementioned Neugebauer et al. article and the Webster and Temple et al. applications teach the process of hermetically sealing apertures in a ceramic package lid by a direct bond between the ceramic lid and a copper foil which extends across apertures in the lid. Such direct bond copper processes as used to form the copper foil-to-ceramic seal, or bonds, are also described in U.S. Pat. Nos. 3,744,120, 3,854,892, and 3,911,553 all issued to Burgess et al.; U.S. Pat. No. 4,129,243 issued to Cusano et al.; U.S. Pat. No. 4,409,278 issued to Jochym; and U.S. Pat. No. 4,563,383 issued to Kuneman et al. These Burgess et al., Cusano et al. and Jochym patents are incorporated herein by reference, and teach the use of copper-copper oxide, nickel-nickel oxide, cobalt-cobalt oxide, iron-iron oxide and copper-copper sulfide eutectics to form direct bonds of the respective substances. The bond contemplated in the instant invention is formed by a copper-copper oxide eutectic mixture which wets both metallic copper and ceramic materials such as aluminum and beryllia and which bonds the members together upon solidification. The copper-copper oxide eutectic process is well known to fabricators of encapsulated devices and modules in the electronics field. A salient aspect of the Neugebauer et al. application Ser. No. 07/603,495, pending applicaiton, teaching is the copper foil conductor thermocompression bonding to the chip aluminum metallization which comprises the chip contact padding. After the composite foil is fabricated, it is etched or stamped into a desired shape which may contain voids or slots (i.e., a lacy construction) in order to reduce thermal expansion mismatch after it is bonded to a chip pad. A special marginal frame design is used to acquire a plurality of leaves in the foil laminate, which leaves extend from the marginal frame to connect with larger foil areas located within the framework. When the proper pattern of foil has been achieved, the foil is thermocompression bonded to the top aluminum padding of the chip. By design, the chip padding aluminum is supplied in excess, and gold in a copper/chromium/gold (Cu/Cr/Au) foil laminate is supplied in modest amounts. The aluminum is not fully consumed by the reaction, but all of the gold on the foil laminate is converted to a stable ($AuAl_2$) intermetallic phase. The remaining boundary layer of excess aluminum metallization on the chip forms a buffer and prevents direct contact with, and delamination from, the silicon chip by the intermetallic; concurrently, an earlier-deposited chromium film on the copper foil forms a barrier layer that prevents copper diffusion into the aluminum film or gold-aluminum matrix, thus avoiding formation of copper-aluminum intermetallics. Once the thermocompression bonding to the chip is completed, the foil frame is excised and the marginal leaves of the foil are bent or retroflexed over the chip margins, superimposing them over the bonded foil portions (central of the frame) from which they extend. The retroflexed leaves provide a stress relief contact for through-the-lid connectors/conductors such as the copper spheres disclosed in the aforementioned Neugebauer et al. IEEE article and hereinafter.

SUMMARY OF THE INVENTION

The instant invention has been devised in order to develop and fabricate hermetic thin pack (HTP) high density power packagings by batch assembly methods that drastically decrease the need for excessive component handling and thereby avoid the most detrimental aspect of the earlier HTP fabrication technology. HTP packagings which include cup containers holding semiconductor chips and which are afforded ceramic lids with some form of through-the-lid conductor mechanism have heretofore required handling of individual lids in final assembly, solder preforms, special frames in the construction and attachment of the cup, thermocompression bonding of copper foil to chip metallization on an individual die level and, in general, excessive handling of individual parts during assembly. These deleterious aspects of the prior art are avoided according to the present invention by thermorompressively bonding a copper foil (with chromium/gold metallization) to a plurality of the semiconductor chips in a chip array, etching unwanted foil and removing it from the chip array, superimposing a gridwork of an insulative and compliant lamina over the chip array, retroflexing the leaves (previously described) over the contact-pad covering foil of all chip units in the chip array, and scribing (to make frangible) and thereafter pelletizing the chip array to obtain the power chip units in a state completely prepared for die mounting in the individual units of a cup array. Next, a frangible array of lids for covering cups in a batch of HTPs is prepared generally by predrilling (with suitable means such as a laser) a plurality of small holes in a large wafer ceramic substrate that is scribed to define a row-by-column lid array and to accommodate in registry therewith a cup fabrication pattern, bonding a continuous sheet of copper over the entire substrate surface and at least the periphery (i.e., marginal areas) of the reverse side (i.e., the side opposite the surface which is completely covered) while inserting by suitable means in the predrilled holes a plurality of high-current conductive spheres, and screening solder cream on the reverse side over the spheres and on the reverse surface copper-foiled marginal or peripheral areas. A strip array (i.e., a narrow array) of cups for the batch formation process is then coined from sheets of copper laminate and the cup array is batch plated with nickel or gold. The unit chips in every cup of the cup array are next die mounted in a posture that assures proper lid superposition of sphere patterns over the leaf patterns of all chip units. The final assembly of the HTPs is completed by placing lid arrays in registry with cup arrays, concomitantly acquiring proper sphere-leaf conductor correspondence between each lid sphere set and each chip leaf set, and performing a final solder reflow in order to make all source, gate, pilot and peripheral seam contacts in a single step for all unit packagings in an array.

Only after the array-to-array (or strip-to-array) solder reflow is completed, are the individual HTPs obtained by breaking along the pre-scribed lines of the substrate-cup assembly. As alternatively contemplated, the lids may be broken out of a ceramic substrate before being joined to the cup array, or individual cups may be disposed upside down on an array of lids, followed by a solder reflowing. As a final alternative, each lid and cup may be assembled individually, on a continuous band basis.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawing(s) in which:

DETAILED DESCRIPTION OF A PREFERRED EMBODIMENT

According to the invention, hermetic thin pack (HTP) semiconductor chip packages are manufactured by following a full batch procedure in which lids are made in batch process, chips are fabricated in batch, and containment cups are coined in batch with subsequent insertion of individual chip devices thereafter. Large array work, the operational factor of the full batch formation concept, is maintained until the last necessary fabrication and assembly event. That last necessary event is, preferably, a cup-with-chip array registry with a lid array and subsequent solder reflowing. Alternatively, the full batch manufacturing process may not be totally suitable for a particular manufacture and, in such case, the lids may be broken out of the ceramic substrate (or lid array) and individually located in a jig on top of the lead frames, followed by disposing individual cups in the jig upside down, mating the cup-lid ensemble and reflowing each package individually on a continuous band basis. Although diminishing somewhat from the full batch manufacturing process, this alternative process in no sense voids the general thesis because use of lid, semiconductor device (with thermocompression bonded copper foil conductors) and cup batch fabrication techniques provide a preponderance of the benefits that are to be gained.

Figure 1A:
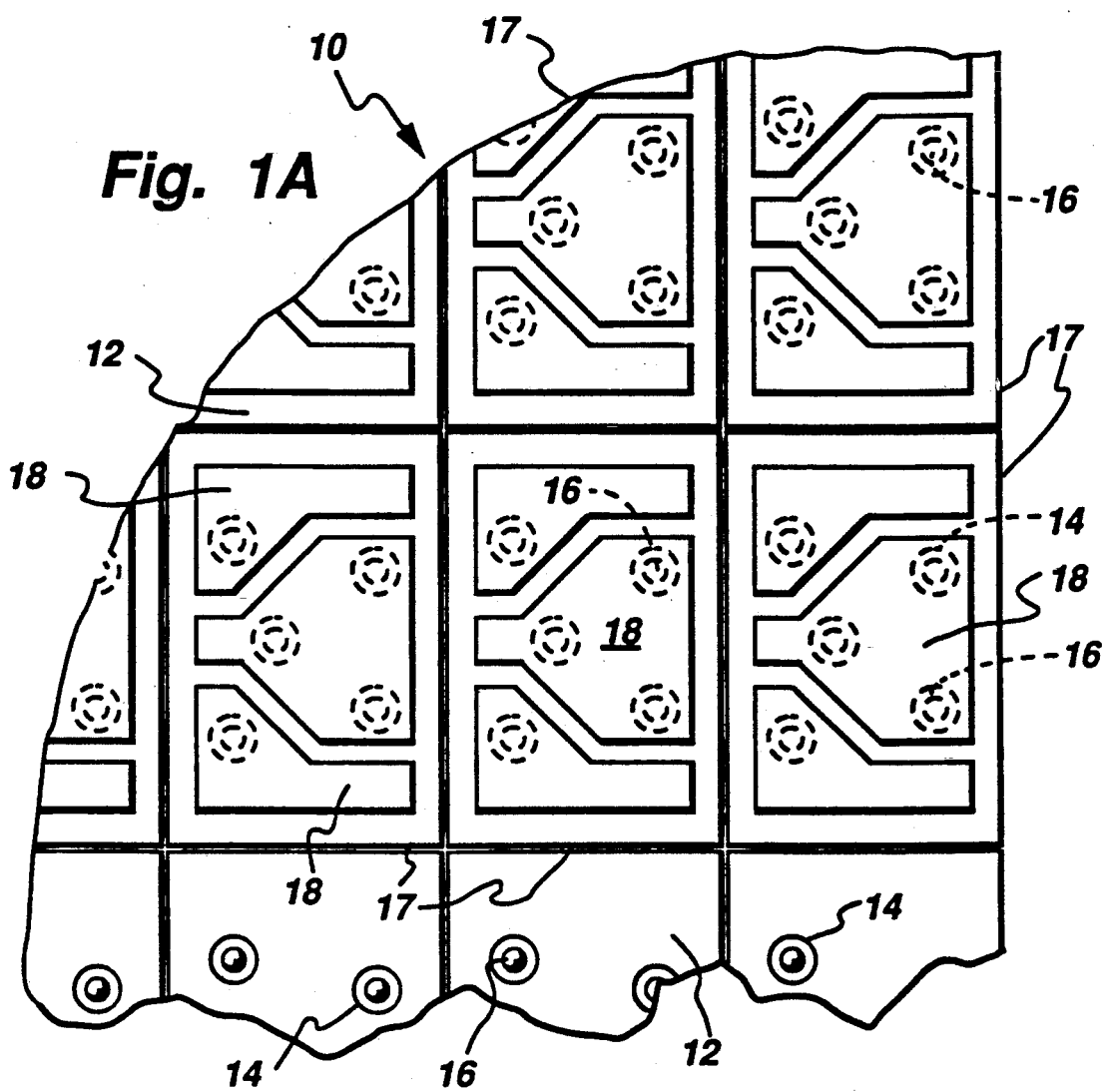
FIG. 1A is a fragmental top plan view of an HTP lid array undergoing preparation.
Figure 1B:
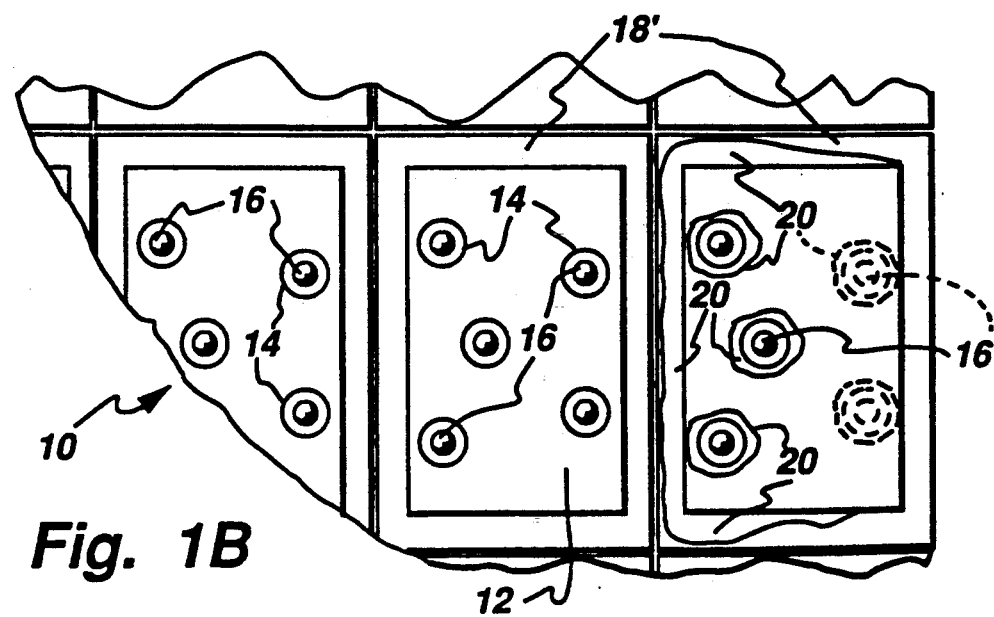
FIG. 1B is a fragmental bottom plan view of the FIG. 1A illustration, with the ceramic substrate absent.

FIGS. 1A and 1B illustrate the various operations employed for acquiring a lid array, a major element in the HTP batch formation process; they are not necessarily depicted sequentially. More particularly, FIG. 1A, is a top plan view depicting a portion of an HTP lid array 10. The lid array comprises a pre-scribed, frangible ceramic substrate 12 of relatively large area, for example, approximately 4×4", containing as many as 60 lids 17. Holes 14 are drilled in predetermined locations in each lid of the array, preferably by use of laser drilling. These holes will correspond with the semiconductor device leaf contacts in their final, retroflexed positions, as described in U.S. patent application Ser. No. 07/603,495, pending application. Rather than breaking out all of lids 17 individually and bonding copper to them individually, as in the conventional technology, the method of the present invention involves bonding a continuous sheet of copper (not illustrated) over the entire substrate 12, on both sides thereof, as described in the herein referenced earlier teachings relating to copper-to-lid bonding techniques. Copper spheres 16 are placed in holes 14 as the aforementioned continuous sheet of copper (not shown) is laid first on one side of the substrate, then on the reverse side of the substrate. Generally the substrate 12 is predrilled as required and then laid on a foil, spheres 16 are bulk or stream deposited thereover so that each hole 14 acquires a single sphere, the foil is folded over the remaining side, and the direct-bonding (eutectic) process is performed. After the foil is eutectic bonded to the substrate, appropriate patterns are etched into the bonded foil 18 over the entire substrate. As indicated in FIG. 1B, a solder cream 20 is screened on at the ball contact locations and the seam areas along the lid peripheries (or margins) 18' on the substrate underside. The lid peripheries that are copper covered are also depicted in FIG. 1B. The solder cream is re-flowed and cleaned of flux, leaving the completed ceramic lid array ready for final assembly. The substrate does not necessarily have to be broken into individual lids at this juncture, but individual cups containing the chips may be flip-mounted on it for simultaneous final re-flow to form sixty or more HTPs at once, as hereinafter described.

FIG. 1B reveals the subroutines or substeps that are applied in the method of batch lid formations by depicting two partially complete, side-by-side (or conterminous) unit lids as they would appear in the FIG. 1A illustration if the ceramic substrate were transparent. Solder cream (or preform) 20 is illustrated on some margins 18' and in the annular area about and over the copper spheres. At this juncture in the fabrication procedure, solder pretinning is accomplished by a reflow of the solder cream to complete the lid array.

A nearly concurrent production (coining) of the cup receptacles in arrays similar to the lids while the lids are being fabricated is desirable. Nonetheless, major advantages in production are gained from the batch fabrication of lids and/or thermocompression bonded semiconductor devices and/or cup receptacles. Thus it is the batch formation of at least two of the three major subassemblies, and not necessarily the concurrent or simultaneous manufacture and assembly of the subassemblies, that is of paramount importance. It is contemplated that the semiconductor devices having thermocompression bonded copper foil contacts have already been fabricated, or provided by some other manufacturing source. Such devices, in a form suitable for die mounting in the aforementioned cup receptacles, are described in detail in U.S. patent application Ser. No. 07/603,495, pending application, by Neugebauer et al.

Figure 2:
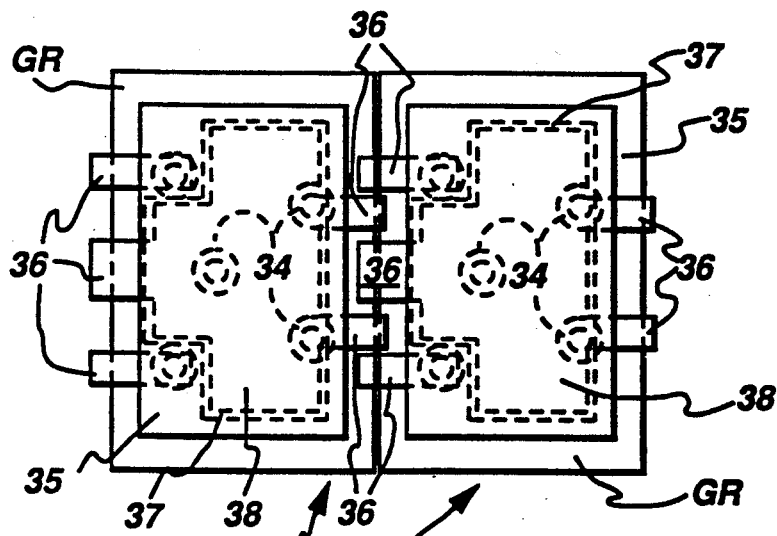
FIG. 2 is a section of a silicon wafer depicting thermocompression bonding of copper foil to two discrete units in the chip wafer array.

FIG. 2 is a top plan view of a pair of electronic semiconductor power chip devices 32 on a silicon wafer of size substantially large enough to produce about sixty devices although, as previously stated, concurrent array-for-array manufacture is not necessary for the semiconductor devices. In FIG. 2, dashed circular areas 34 indicate the positions of the copper spheres 16 that would be located in the corresponding lid structures. Leaves 36 of each chip are free from connections to adjacent chips and are ready for retroflexion over pad areas 37 from which they extend. After the frames are excised from conductor foil 38, a lamina 35 of insulative material may be superimposed on the entire copper foil area, exclusive of leaves 36, in order to provide an insulative (if required) layer after the leaves are retroflexed over the areas of chip metallization 37 from which they extend. In a preferred embodiment, lamina 35 comprises a polyimide such as Kapton (trademark of E. I. duPont de Nemours and Company), a high temperature plastic.

It is evident from the above description, that the contact pattern is generally comprised of the emitter or source contact (for low resistance), the gate contact, and the contact leaves which will mate through spheres 16 to the corresponding area of patterned contact 18 on the lid. Contact leaves 36 are relatively large in area so as to tolerate relatively large misregistry of the lid contact. The chip array contact areas 38 result in an interdigitated pattern of leaves 36, where the leaves overlap the guard ring regions GR of the neighboring chip. The guard ring GR regions are provided in order to preclude contact of foil conductors with portions of cup and lid components.

After etching of the foil into a desired shape, a polyimide or other suitable insulating, compliant lamina 35 is superimposed over the array and the contact leaf extensions 36 are retroflexed, a process which may be accomplished by means of an air knife which first lifts and retroflexes the tabs on one side of chips in the array, and then those on the other side. The polyimide lamina 35 is sufficient to provide an insulative layer over the preponderance of contact area and can conceivably extend into the guard ring region. This is so that, after the extension leaves are retroflexed approximately 150° toward the respective pads from which they extend, there will be provided an automatic Z direction alignment with the lid contacts, so that all tabs will be contacted in the final solder reflow step. The Z direction is normal to the plane of the array. The polyimide lamina 35 assures complete isolation of the contact area with respect to the lid and cup margins and other surfaces. Chips, complete in every detail save installation into a packaging, are now scribed and pelletized. The chips, bearing thermocompression bonded contacts, are die bonded into the coined cups in the final assembly process, using high temperature soft solders such as 95% Pb, 55% Sn; or 92.5% Pb, 2.5% Sn, 2.5% Ag; or high temperature hard solders such as AuSn 31, AuGe 33 or AuIn. The contact leaves extend upwardly above the level of the rim of the cup, but are substantially (i.e., within 30°) coplanar with the thermocompression bonded foil contacts of the chip. At this point in the assembly process, a chip-cup array, or an individual cup with a chip disposed therein, is ready for registry with a lid array, to be followed by a final solder reflow step.

Sheets of Cu/Mo/Cu, having a thickness ranging from 0.005 to 0.015 in., or copper of 0.005 to 0.010 in. thickness, provide the base material from which a cup is coined into substantially a bathtub shape. A cup rim is generally about 0.050 inches wide in order to mate with the lid underside, while the bottom of the cup is large enough to accommodate the chip for die mounting therein, a subprocess requiring a flat area of at least 0.400×0.280 inches. The cups are first preferably nickel plated, and then chip die attachment into the cups takes place while cups are arrayed or strung together as a continuous strip. The individual cups are separated later for flip mounting onto lids, or arraywise mounting to the substrate containing an array of lids.

Figure 3A:
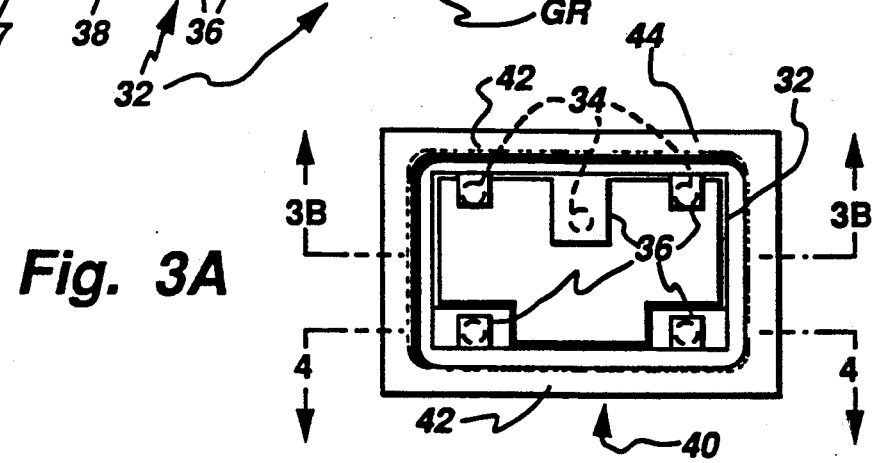
FIG. 3A is a top plan schematic view of a coined cup of the invention depicting a semiconductor chip disposed therein.
Figure 3B:
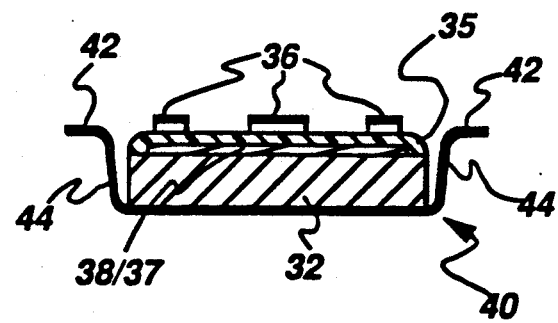
FIG. 3B is an orthographic side elevation of FIG. 3A taken along line 3B—3B of FIG. 3A.

FIGS. 3A and 3B depict a top plan schematic view and a side elevation view, respectively, of a discrete cup 40 with its general bathtub morphology, defined by the rim 42 and side walls 44. Chip 32 resides in the cup well, with contact extension leaves 36 protruding slightly above the cup rim and in approximate superposition with the chip top surface. For clarity, "lacy" construction, i.e., thermocompression foil slots for affording stress relief, is not depicted but is preferably employed. Since the ceramic lid substrate has a solder cream coating 20 at the bottom side of the lid patterns 18', as indicated in FIG. 1B, the upwardly facing margins 42 of the cup or cup array may now receive the same. Once the HTP formation process has reached this stage, final assembly may be performed.

Final Assembly Process

Figure 4:
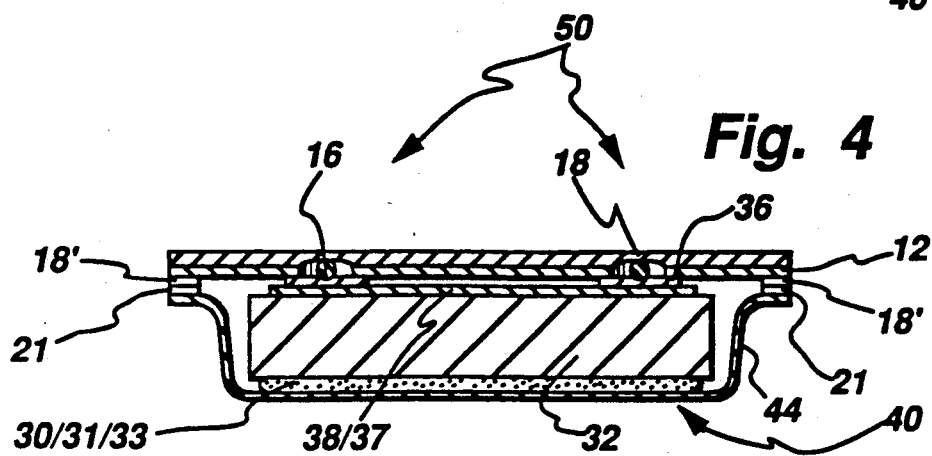
FIG. 4 is a cross-sectional elevation of an assembled HTP taken along line 4—4 of FIG. 3A.

The cups, containing chips with contact leaves extended slightly above the cup rims, are turned upside down and are positioned on the lid substrate, one cup corresponding to one lid location, or cup-to-lid registry. A discrete cup-lid assembly 50, without insulative lamina 35 shown in FIG. 3B, is illustrated in FIG. 4. Relatively large misplacement may be tolerated in the substrate plane, and any Z direction misalignment is ameliorated by the angular position of leaves 36, which push individually against the lid bottom solder contacts 20 (shown in FIG. 1A). The lid substrate with registered cups is solder reflowed in one final step in order to make the source, gate, pilot, and seam (margin) contacts all at once, and the packages are tested while still part of the substrate. Finally, the individual HTPs are dissociated from the array by breaking along the scribe lines of the substrate-cup array. The assembly shown in FIG. 4 is illustrative of a typical HTP made by this unique batch formation process. The HTP unit 50 is a package preferably measuring approximately 400×260 mils with a chip-to-cup internal clearance of approximately 5 mils. Chip 32 resides in cup 40, covered by a lid comprising a direct bonded copper cover 18 on substrate 12, and is hermetically sealed by solder 21, generally AuSn 31 during the final reflow steps.

In an alternative subprocess of the final assembly process, the lids are broken out of the ceramic substrate, located in a jig (not shown) on top of lead frames (not shown) soldered to copper cover 18, and individual cups are then located in the jig upside down. Each package is thereafter solder reflowed on a continuous band basis.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method of fabricating, by batch assembly, high density power semiconductor chip hermetic thin packagings which include cups as containers, semiconductor chips and lids with through-the-lid spherical conductors, said method comprising the steps of:
  (A) thermocompression bonding copper foil to metallized contact padding of chips of a semiconductor chip array, said foil comprising angularly positioned extension leaves extending outward from chip contact pad-covering portions of the foil;
  (B) etching unwanted foil away from said chip array to allow only pad-covering foil with said extension leaves to remain superimposed on portions of said chip array;
  (C) superimposing a preformed insulative lamina of compliant material over said chip array so that at least contact pad-covering foil on chips of said chip array is covered by said insulative lamina;
  (D) retroflexing said leaves over their respective pad-covering portions of said foil;
  (E) scribing and pelletizing said chip array to separate individual chips, each of the separated chips being defined by a thermocompression bonded copper conductor-to-chip metallized pad including retroflexed copper conductor leaves also bearing upon said insulative lamina;
  (F) preparing an array of lids for covering cups in a bath of said packagings by
    (i) drilling a plurality of holes in a ceramic substrate to provide through-said-substrate communication means,
    (ii) scribing a grid on said ceramic substrate so as to define an array of spearable lids, said substrate having an upper and lower surface,
    (iii) inserting conductive spheres in said holes,
    (iv) eutectically bonding a second copper foil entirely over both surfaces of said ceramic substrate,
    (v) etching patterns into said second copper foil on the upper side thereof, and
    (vi) screening solder cream on the underside of said substrate proximate and over said spheres and on said reverse surface at peripheral, copper-covered margins thereof;
  (G) coining from copper laminate an array of cups sized to fit in close superpositional registry with said array of lids such that individual lids of the lid array will register with individual cups of the cup arrays, said coining including
    (i) shaping individual cups in said cup array into a bathtub configuration, and
    (ii) nickel plating the individual cups;
  (H) die mounting a respective chip in each respective cup of said cup array to produce a cup-with-chip partial assemblage wherein said copper foil extension leaves of each chip are exposed in predetermined positions to accept thereover corresponding lid patterns of said second copper foil superimposed on leaf patterns of said chips;
(I) placing each respective lid of said array of lids in registry with each respective cup of said array of cups containing a chip therein; and
(J) solder reflowing to make contact to each respective one of said chips through the respective lid thereover in a single step.

2. The method of claim 1 wherein step (I) comprises positioning said partial assemblage with respect to said reverse surface of said array of lids so that said copper foil leaves of said chips in said partial assemblage contact said spheres to assure, for each respective cup, correspondence between the lid spheres and chip leaves thereof.

3. The method of claim 1 wherein step (I) further includes separating each of said lids from said array of lids, positioning a lid in a jig on top of a lead frame, positioning a cup from said array of cups in said jig in contact with said lid, and solder reflowing mutually contacting copper surfaces of said lid and said cup, and wherein step (J) is thereafter reiterated on a continuous band basis.

4. A batch fabricating method for making and assembling hermetic thin packagings, comprising the steps of:
  (a) thermorompressively bonding chromium/gold-layered copper foil to aluminized contact padding of semiconductor chips in a chip array;
  (b) removing unwanted foil to acquire a desired pattern for providing predesignated angularly positioned contact elements on said chip;
  (c) scribing and pelletizing said chip array to define individual chips in which all of said chips are defined by a single template comprising thermocompressively bonded copper foil conductor-to-chip contact pads;
  (d) preparing a frangible array of lids on a ceramic substrate and providing said substrate with discrete direct-bonded copper upper surfaces, through-the-lid current conduction means and direct-bonded copper continuous marginal surfaces at the underside of said lids;
  (e) pretinning said marginal copper surfaces and said conduction means;
  (f) coining cups, with marginal surfaces, from sheets of copper laminate and thereafter affixing in each cup thus coined, at least one chip disposed to receive thereover one of said lids;
  (g) placing a lid in registry with a cup containing a chip therein so that said cup and lid marginal surfaces make contact and said lid conduction means contacts said predesignated angularly positioned contact elements of said thermocompressively bonded copper foil of a chip; and
  (h) solder reflowing to bond all abutting marginal surfaces to each other and to bond all portions of said lid conduction means in abutment with respective contact elements.

5. The method of claim 4 in which step (b) comprises etching said foil to define discrete angularly positioned foil contact elements of an unbonded, extensive leaf type conductor, and retroflexively folding said angularly positioned leaf type contact elements over foil contact portions from which they extend.

6. The method of claim 4 in which preparing said frangible array of lids comprises creating a plurality of holes in said lids to receive therein a corresponding plurality of conductive spheres.

7. The method of claim 6 in which said preparing step further includes inserting a conductive sphere in each hole provided in said lids.

8. The method of claim 4 wherein said pretinning comprises screening solder cream on said copper marginal surfaces and said conduction means.

* * * * *